United States Patent [19]
Yeh

[11] Patent Number: 6,060,900
[45] Date of Patent: May 9, 2000

[54] METHOD FOR MEASURING CURRENT DENSITY IN A SEMICONDUCTOR DEVICE WITH KINK EFFECT

[75] Inventor: Meng-Lin Yeh, Taipei, Taiwan

[73] Assignee: United Semicondutor Circuit Corp., Taiwan

[21] Appl. No.: 09/106,752

[22] Filed: Jun. 30, 1998

[51] Int. Cl.[7] .................................................. G01R 31/26
[52] U.S. Cl. ............................................ 324/769; 324/765
[58] Field of Search ................................ 324/765, 158.1, 324/73.1, 769, 768, 716, 719; 438/427, 431, 154, 347; 257/40, 48

[56] References Cited

U.S. PATENT DOCUMENTS 4,965,213  10/1990  Blake ........................................ 438/154
5,489,792   2/1996  Hu et al. .................................. 257/347

*Primary Examiner*—Vinh P. Nguyen

[57] ABSTRACT

A method for measuring kink effect of a first semiconductor device including the following steps is disclosed herein. Firstly, choose a second and a third semiconductor device. The first, the second and the third semiconductor device have the same channel length and different channel width. The next step, apply a voltage on the drain electrode of respective semiconductor device. The voltage is applied to the drain electrode and the DIBL effect is avoided. The following step, measure the threshold voltage of every. Next, measure the source to drain current by applying the respective threshold voltages on the respective gate electrode of every semiconductor device. Subsequently, generates a slope by dividing a first drain current difference by a first channel width difference. The first drain current difference is formed of subtracting a second drain to source current of the second semiconductor devices by and a third drain to source current of the third semiconductor device. The first channel width difference is formed of subtracting the second channel width of the second semiconductor device and the third channel width of the third semiconductor device. Then, subtract a first drain to source current of the first semiconductor device by a product to acquire a parasitic current. The product is formed of the product of the slope and the channel width of the third semiconductor. Finally, divide the parasitic current by a channel length of the first semiconductor device to obtain the linear current density as the index representing the kink effect of the first semiconductor device.

2 Claims, 6 Drawing Sheets

| length=10μm | | width=10μm(W1) | width=5μm(W2) | width=2μm(W3) | m=slope | $I_{ds_n}$ | J_parasitice |
|---|---|---|---|---|---|---|---|
| | $V_t$ | $I_{ds_1}$ | $I_{ds_2}$ | $I_{ds_3}$ | $(I_{ds_1}-I_{ds_1})/(W_1-W_2)$ | | (A/μm) |
| NMOS | 0.83 | 3.1666E-07 | 1.6648E-07 | 8.3632E-08 | 3.0036E-08 | 1.178E-08 | 1.178E-09 |
| NMOS-KF | 0.87 | 3.5381E-07 | 1.9223E-07 | 9.0067E-08 | 3.2316E-08 | 1.27175E-08 | 1.272E-09 |
| PMOS | -1.02 | -7.643E-08 | -5.14E-08 | -3.4485E-08 | -5.006E-09 | -1.223365E-08 | -1.224E-09 |
| NMOS-KF | -0.94 | -6.1285E-08 | -3.6049E-08 | -2.0282E-08 | -5.0938E-09 | -5.0938E-09 | -5.094E-10 |

METHOD FOR MEASURING CURRENT DENSITY IN A SEMICONDUCTOR DEVICE WITH KINK EFFECT

BACKGROUND OF THE INVENTION

1. Field of the Invention

This invention relates to a method for measuring the kink effect of a transistor, particularly relates to a method for measuring the kink effect with an index representing to what extent the kink effect influence the transistor.

2. Description of the Prior Art

As the dimension of the semiconductor device is shrunk, the shallow trench isolation (STI) is usually used in isolation structure. The profile of STI has a strong relationship with the kink effect of the transistor. The condition increasing the kink effect is described as the following: the decrease of the radius r of the birds beak, the decrease of the side wall angle 74, and the decrease of the terren height h. The change of the aforementioned factor result in the semiconductor device enters a weak inversion state.

The definition of the kink effect in the STI technology is identical with the hump effect, the corner effect, the edge effect, and the corner parasitic effect. As shown in FIG. 1, if there is an electrical field 10 crowding at the channel near the STI-active edge, and a voltage is applied to the channel by the gate poly 11. The corner electrical field 10a is larger than the channel center electrical field 10b. So the channel at the corner is formed before the whole channel enter the strong inversion state. In other words, a parasitic device is formed before the gate voltage reaches the threshold voltage. Even though the transistor is in the off state, the channel is still formed by the parasitic device, and the off current (standby current: $I_{off}$) is thus increased. Thus the parasitic device is formed bin the STI corner 18.

The factors mentioned above have an influence in the kink effect, so it is important to control the forgoing factors. To describe the kink effect in the semiconductor device, the traditional technology uses the difference of the gate voltage where the kink effect occurs as an index. If the kink effect exists, the difference of the gate voltage mentioned above must exist.

As usually used, the change of the logarithm of drain current versus gate voltage ($\log(I_{ds})$ versus $V_g$) is a traditional method to observe how the semiconductor device is influenced by the kink effect. As shown in FIG. 2A, the drain current versus gate voltage curve ($I_{ds}$-$V_g$ curve) of a kink effect free device with various substrate bias is smooth. When the substrate bias is 0 volt, the $I_{ds}$-$V_g$ curve is curve 200, whereas, when the substrate bias is 1 volt, the $I_{ds}$-$V_g$ curve is curve 201. The x-axis represents the gate voltage ($V_g$) of the semiconductor device, and the y-axis represents the logarithm of the drain current ($\log(I_{ds})$). When the $I_{ds}$-$V_g$ curve of a device with kink effect is plotted, the result is shown in FIG. 2B. When the substrate bias is 0 volt, the $I_{ds}$-$V_g$ curve is curve 210, whereas, when the substrate bias is 1 volt, the $I_{ds}$-$V_g$ curve is curve 211. It is obvious that when the semiconductor device with kink effect is utilized, there is some torsion in the $I_{ds}$-$V_g$ curves.

When the first order partial derivative of the $I_{ds}$-$V_g$ curve to gate voltage ($V_g$) is taken, the drawing is shown in FIG. 3A. At this occurrence, the semiconductor device is kink effect free and the substrate bias is 2 volt. The curve 230 represents the logarithm value of the drain current ($\log(I_{ds})$) and the curve 231 represents the transconductance ($g_m$) of the semiconductor device when the substrate bias is 2 volt. As shown in FIG. 3B, the curve 240 represents the logarithm value of the drain current ($\log(I_{ds})$) when the semiconductor device has the kink effect and the substrate bias is 2 volt. The curve 241 represents the transconductance ($g_m$) of the semiconductor device when the substrate bias is 2 volt. It is obvious that, at some gate voltages, the transconductance has local maximum and local minimum.

When the second order partial derivative of the $I_{ds}$-$V_g$ curve to gate voltage ($V_g$) is taken; the plot is shown in FIG. 4A. At this occurrence, the semiconductor device is kink effect free and the substrate bias is 2 volt. The curve 250 represents the logarithm value of the drain current ($\log(I_{ds})$) and the curve 251 represents the transconductance ($g_m$) of the semiconductor device when the substrate bias is 2 volt. As shown in FIG. 4B, the curve 260 represents the logarithm value of the drain current ($\log(I_{ds})$) when the semiconductor device has the kink effect and the substrate bias is 2 volt. The curve 261 represents the transconductance ($g_m$) of the semiconductor device when the substrate bias is 2 volt. It is obvious that, at point A and point B, the transconductance has local minimum. At point C and point D, the transconductance has local maximum.

When the parasitic device enter the threshold state, the second order partial derivative of the $I_{ds}$-$V_g$ curve has the local minimum at the point A. When the channel of the semiconductor device enter threshold state, the second order partial derivative of the $I_{ds}$-$V_g$ curve has the local minimum at the point B. The point D stands for the occurrence that the channel of the semiconductor device enter the weak inversion. The point C represents the occurrence that the kink effect has the most serious influence. The point C and the point D both represent the start point of the change of increment of the channel current or the transconductance. So the point A and the point B represent the beginning and the end of the operation of the parasitic device respectively.

Observing the difference of gate voltage between the point A and point B, if the kink effect exists, then the difference of gate voltage between the point A and point B exists. Thus the traditional technology uses the difference of gate voltage between the point A and point B as an index. When the difference of gate voltage between the point A and point B exist, the kink effect exists in the semiconductor device. So the traditional technology use the maximum value of the second order partial derivative of the $I_{ds}$-$V_g$ curve to represent the influence of the kink effect.

To illustrate the kink effect in a semiconductor device, the traditional technology uses the difference of the gate voltage in the second order derivative of the drain current versus gate voltage ($I_{ds}$-$V_g$) as shown in FIG. 4B as the index. Though the traditional technology can describe the kink effect, the traditional technology can not describe to what extent that the kink effect influences the semiconductor. If two semiconductor devices have the same subtraction of gate voltage between the point A and point B, besides, the point C of the two semiconductor devices should be different. In other words, the point C of one of the semiconductor device is different from that of the other. It is obvious that the kink effect in the two semiconductor devices influence the two semiconductor devices to different extents. Whereas, the traditional technology can not tell the difference of the extent that the kink effect influences the forgoing semiconductor devices.

Because the unit of the expression of the foregoing representation is ($\log(A)/V^2$), the increment of standby current resulted from kink effect and the static power assumption can not be described in the traditional technology. In addition, in the laboratory, the kink effect is measured by comparing the log($I_d$)-$V_g$ curve of a semiconductor device with kink effect and without kink effect. Whereas the aforementioned method can not be used in the wafer assurance testing (WAT) in mass production. Though a prior art ("ANALYSIS OF WIDTH EDGE EFFECT IN ADVANCED ISOLATION SCHEMES FOR DEEP SUBMICRON CMOS TECHNOLOGY" BY Psallagolity, M. Ada-HANIFI, M. Paoli, and Haond, IEEE Transactions on electron devices vol. 43, November 1996) indicates that the difference of the gate voltage when the parasitic channel enters the threshold and when the channel of the semiconductor device enter the strong inversion can be used as an index for the kink effect. However, the method mentioned above can not describe the influence of the kink effect when the semiconductor device is in the off mode.

SUMMARY OF THE INVENTION

A method for measuring kink effect of a first semiconductor device including the following steps is disclosed herein. Firstly, choose a second and a third semiconductor device. The first, the second and the third semiconductor device have the same channel length and different channel width. The next step, apply a voltage on the drain electrode of respective semiconductor device. The voltage is applied to the drain electrode and the DIBL (Drain Induced Barrier Lowering) effect is avoided.

The following step, measure the threshold voltage of every. Next, measure the source to drain current by applying the respective threshold voltages on the respective gate electrode of every semiconductor device. Subsequently, generates a slope by dividing a first drain current difference by a first channel width difference. The first drain current difference is formed of subtracting a second drain to source current of the second semiconductor devices by and a third drain to source current of the third semiconductor device. The first channel width difference is formed of subtracting the second channel width of the second semiconductor device and the third channel width of the third semiconductor device.

Then, subtract a first drain to source current of the first semiconductor device by a product to acquire a parasitic current. The product is formed of the product of the slope and the channel width of the third semiconductor. Finally, divide the parasitic current by a channel length of the first semiconductor device to obtain the linear current density as the index representing the kink effect of the first semiconductor device.

BRIEF DESCRIPTION OF THE DRAWINGS

The above features of the present invention will be more clearly understood from consideration of the following descriptions in connection with accompanying drawings in which:

FIG. 7 illustrates the plot of the drain to source current versus channel width of the four sets of semiconductor devices being tested according to the preferred embodiment.

DESCRIPTION OF THE PREFERRED EMBODIMENT

The present invention provides a method for measuring the kink effect in a semiconductor device. The proposed method in the present invention is to generate an index relating to the current density between the drain and the source electrode when the semiconductor device is in the weak inversion mode. The parasitic device at the STI corner 18 produced by the kink effect may results in the abnormal increase in the drain current when the semiconductor device is in the weak inversion state. Whereas the traditional technology can not indicate the abnormal increase in the drain current, it only describes the existence of the kink effect. So the present invention proposes a method for measuring the kink effect in a semiconductor device, and the index provided by the present invention can describe the abnormal increase in the drain current of the semiconductor device.

Figure 1:
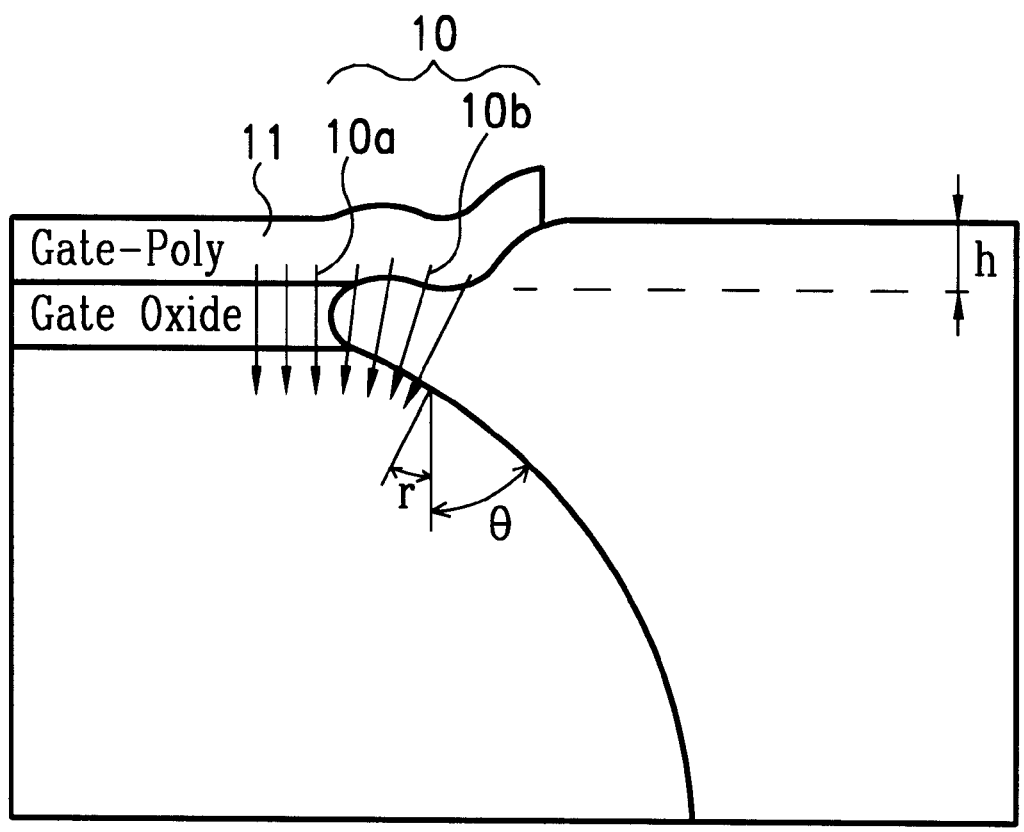
FIG. 1 is a cross sectional view of a wafer illustrating the factors affecting the kink effect of the semiconductor device.
Figure 2A:
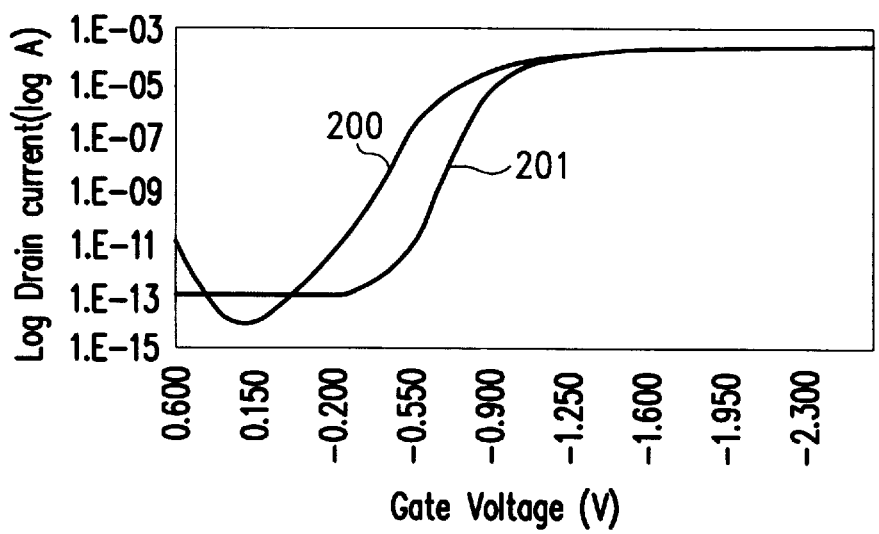
FIG. 2A illustrates the log($I_{ds}$)-$V_g$ curve of the kink effect free semiconductor device, wherein various substrate voltages are applied to the semiconductor device.
Figure 2B:
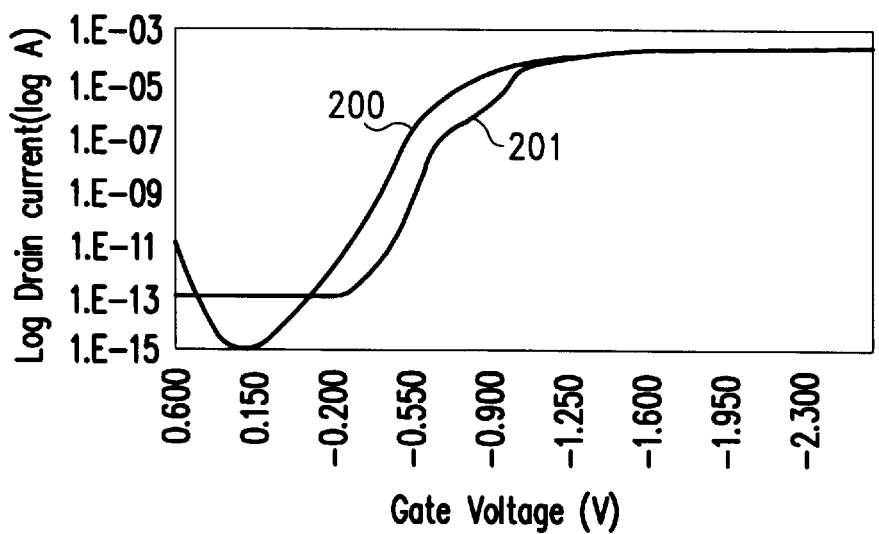
FIG. 2B illustrates the log($I_{ds}$)-$V_g$ curve of a semiconductor device with kink effect, wherein various substrate voltages are applied to the semiconductor device.
Figure 3A:
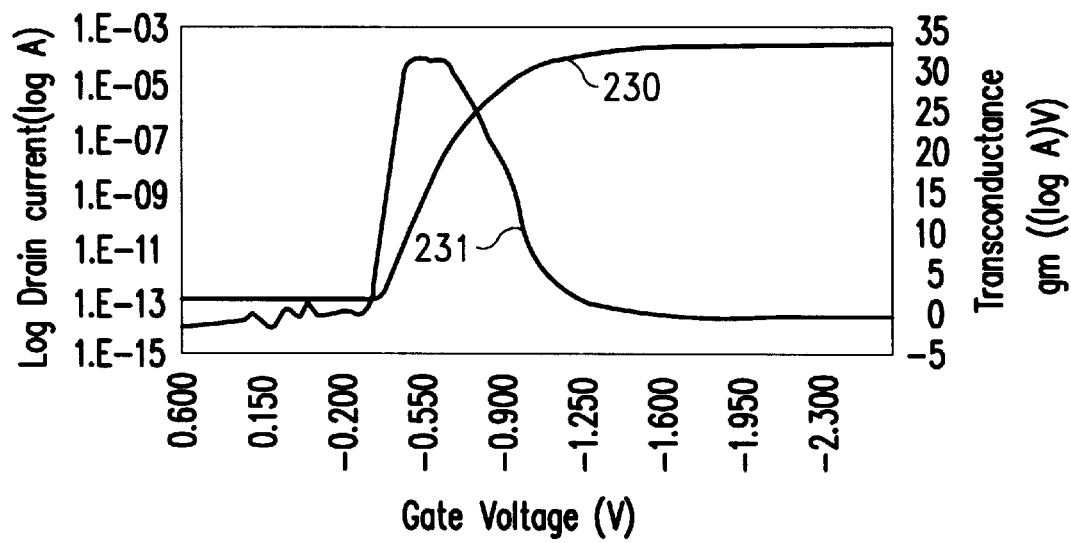
FIG. 3A illustrates the first order of log($I_{ds}$)-$V_g$ curve of the kink effect free semiconductor device, wherein the transconductance is also shown in FIG. 3A.
Figure 3B:
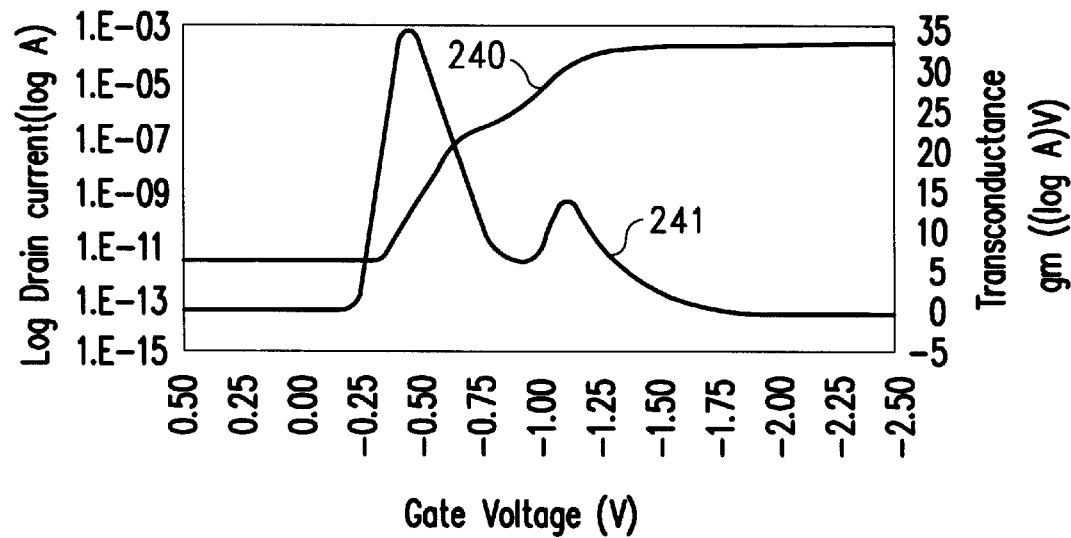
FIG. 3B illustrates the first order of log($I_{ds}$)-$V_g$ curve of the semiconductor device with the kink effect, wherein the transconductance is also shown in FIG. 3B.
Figure 4A:
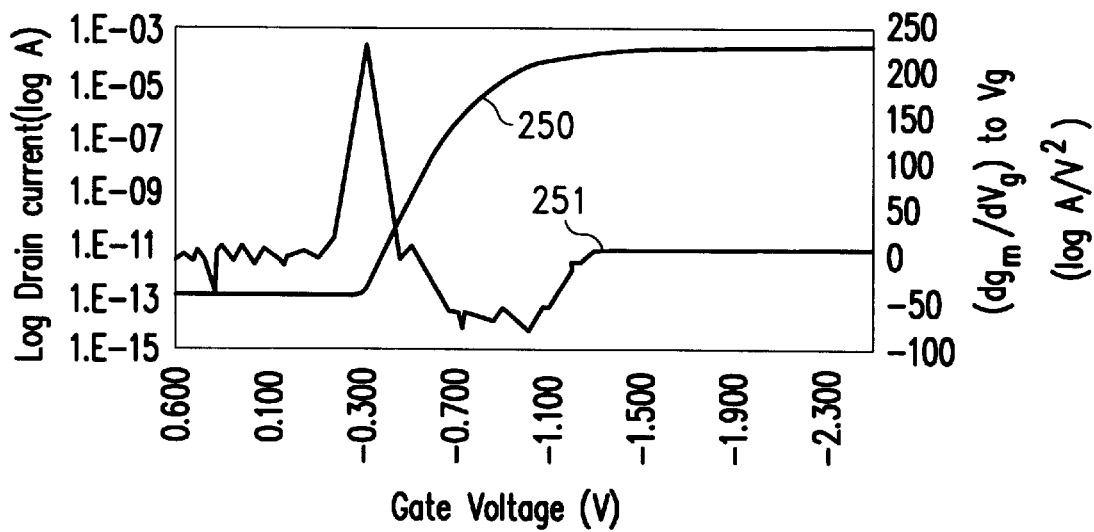
FIG. 4A illustrates the second order of log($I_{ds}$)-$V_g$ curve of the kink effect free semiconductor device, wherein the derivative of the transconductance to the gate voltage is also shown in FIG. 4A.
Figure 4B:
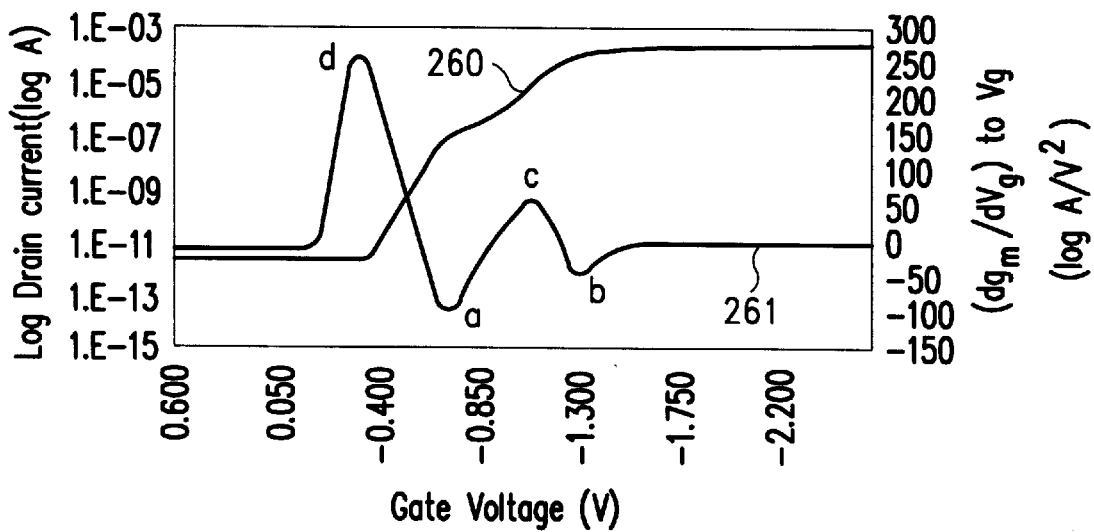
FIG. 4B illustrates the second order of log($I_{ds}$)-$V_g$ curve of the semiconductor device with the kink effect, wherein the derivative of the transconductance to the gate voltage is also shown in FIG. 4B.

Turning back to FIG. 1, when the semiconductor device (MOS) is in the off mode (weak inversion state). The parasitic drain to source current ($I_{ds}$) at STI corner 18 caused by the parasitic device which resulted from the kink effect causes the drain current increase abnormally. When the semiconductor device (MOS) is in the off mode, the current between the source and the drain electrodes has two components; both of them can not be ignored. At this occurrence, the drain current $I_{ds}$ can be illustrated as two components $I_{ds\_center}$ and $I_{ds\_parasitic}$ respectively. In which the component $I_{ds\_center}$ is the current in the center of the channel when the semiconductor device is in the weak inversion state. Besides, the component $I_{ds\_parasitic}$ is the current in the STI corner 18 when the semiconductor device is in the weak inversion state. So the drain current can be expressed as:

$$I_{ds} = I_{ds\_center} + 2 \cdot I_{ds\_parasitic} \quad (1)$$

It is widely described in the micro-electronics that the drain current in a semiconductor device is a function of the voltage cross the gate electrode ($V_g$), the voltage cross the drain electrode and the source electrode ($V_{ds}$), and the aspect ratio (W/L) of the semiconductor device. In which the aspect ratio is the ratio of the width (W) of the semiconductor device to the length (L) of the semiconductor device. So the drain current expressed in the micro-electronics is:

$$I_{ds}(W/L, V_g, V_{ds}) = (W/L) \cdot \mu \cdot C_{ox}[(V_{gs}-V_t) \cdot V_{ds} - 0.5 \cdot (1+\delta) \cdot V_{ds}^2] \quad (2)$$

In equation (2), $\mu$ is a constant, $C_{ox}$ is the index of capacitance of the gate oxide, $V_t$ is the threshold voltage, and $\delta$ is the channel length modulation parameter of the semiconductor device. In the weak inversion state of a semiconductor device, the gate-to-drain voltage is equal to the threshold voltage of the semiconductor device. At this occurrence, $V_{gs}=V_t$ and equation (2) can be induced as follows:

$$I_{ds}=(W/L)\cdot\mu\cdot C_{ox}[(-1)\cdot 0.5\cdot(1+\delta)\cdot V_{ds}^2] \quad (3)$$

To reduce the changeable parameters in the equation (3), the semiconductor devices of the same channel length L are taken into account, and the voltage crosses the drain and the source electrode ($V_{ds}$) are substituted by 0.1 volt. In addition, to measure the semiconductor devices of the same $\delta$, the neighbor semiconductor devices are taken into account. The value that substituted in the $V_{ds}$ is a specific value that the DIBL (Drain Induced Barrier Lowering) effect of the semiconductor device can be avoided. For the forgoing description, the drain current $I_{ds}$ is proportional to the channel width W of the semiconductor device. From equation (1), the drain current caused by the kink effect, i.e., $I_{ds\_parasitic}$ can be obtained by acquiring $I_{ds}$ and $I_{ds\_center}$. In addition, when $I_{ds\_center}$ equals to zero, the drain current ($I_{ds}$) at this occurrence is equal to twice of $I_{ds\_parasitic}$.

For the aforementioned description, the drain current caused by the kink effect can be obtained by the following description. Measure the drain current of three neighboring semiconductor devices of different channel width at the gate voltage equals to the threshold voltage. Take a PMOS for example, when the channel length is 10 micro meters, the gate voltage is equal to the threshold voltage, the voltage cross the drain electrode is equal to 0.1 volt, and the voltage cross the substrate is equal to 2 volts. A test is used to acquire the drain current, and the result is shown in FIG. 5, which is the drawing of the drain current ($I_{ds}$) versus channel width (W).

Figure 5:
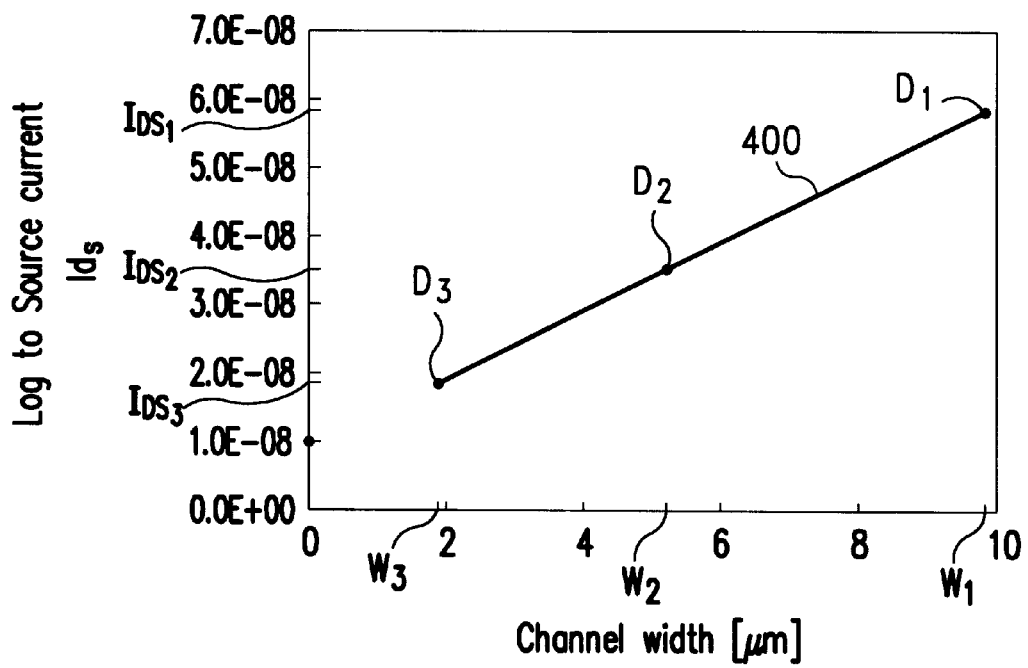
FIG. 5 illustrates the plot of the drain to source current versus channel width of the three semiconductor devices.

The extension line of line 400 crosses the y axis of FIG. 5 at a point P. The distance between the original point O and the point P represents the drain current when the channel is equal to 0. Whereas, as shown in equation (3), when the channel is equal to zero, the drain current should be equal to zero. So a modifying term $I_{ds_0}$ should be added to equation (3). Thus the drain current is:

$$I_{ds}=(W/L)\cdot\mu\cdot C_{ox}[(-1)\cdot 0.5\cdot(1+\delta)\cdot V_{ds}^2]+I_{ds_0} \quad (4)$$

Wherein, $I_{ds_0}=V_{ds}/R_0$, $R_0=\Delta I_{ds}/\Delta V_{ds}$ at this occurrence, the channel length L is fixed, and $V_{gs}=V_t$. Referring to equation (1), when the channel is equal to zero, the drain current ($I_{ds}$) is equal to $2\cdot I_{ds\_parasitic}$. So the drain current caused by kink effect at the fixed channel length and Vd=0.1 volt can be represented by the modifying term $I_{ds_0}$. Further more, to normalize the factor channel length, the drain current caused by kink effect $I_{ds_0}$ is divided by channel length L, thus the linear current density caused by the kink effect, i.e., the linear current density in the parasitic device is:

$$J\_parasitic=I_{ds_0}/L \quad (5)$$

L: channel length of the semiconductor, the unit of J_parasitic is A/$\mu$m.

Thus the linear current density acquired by an extrapolation method can be the index representing the extent that the kink effect influence the semiconductor device in the weak inversion state.

From the forgoing description, the present invention provides a method obtaining the index representing to what extent that the parasitic device caused by kink effect influence the semiconductor device. At first, choose three semiconductor devices of the same channel length and different channel width. As noted, the channel length must be chosen to avoid the short channel effect and the inverse narrow width effect. Secondary, to avoid the DIBL effect, set the magnitude of the drain voltage $V_d$ equal to 0.1, and the source voltage $V_s$ is equal to 0. Then, measure the threshold voltage $V_t$ of the three semiconductor devices. The third step is to apply the threshold voltage to the gate electrode of the individual semiconductors and then measure the drain current $I_{ds}$. In other words, let $V_{gs}=V_t$, then measure drain current to obtain $I_{ds_1}$, $I_{ds_2}$, and $I_{ds_3}$ (as shown in FIG. 5). The third step is to calculate the slope m of the line 400 using point $D_1$ and $D_2$. The drain current of the point $D_1$, $D_2$, and $D_3$ are $I_{ds_1}$, $I_{ds_2}$, and $I_{ds_3}$ respectively, and the channel width of the semiconductor device represented by the point $D_1$, $D_2$, and $D_3$, are $W_1$, $W_2$, and $W_3$ respectively. The slope m can be acquired by:

$$m=(I_{ds_1}-I_{ds_2})/(W_1-W_2) \quad (6)$$

Then the equation of the line ($I_{ds}$) passing through the three points can be expressed as:

$$I_{ds}=m\cdot W+I_{ds_0} \quad (7)$$

Wherein, the drain to source current $I_{ds}$ is equal to the term $I_{ds_0}$ when the channel width W is zero. The fifth step is to substitute the point $D3(I_{ds_3},W_3)$ into equation (7) to acquire $I_{ds_0}$. The sixth step is to normalize the channel length factor by obtaining linear current density using the following equation:

$$J\_parasitic=I_{ds_0}/L \quad (8)$$

L is the channel length of the semiconductor device. The linear current density J_parasitic having the unit A/m (Amper/micro meter) is the index relative to the STI process kink effect.

Figure 6:
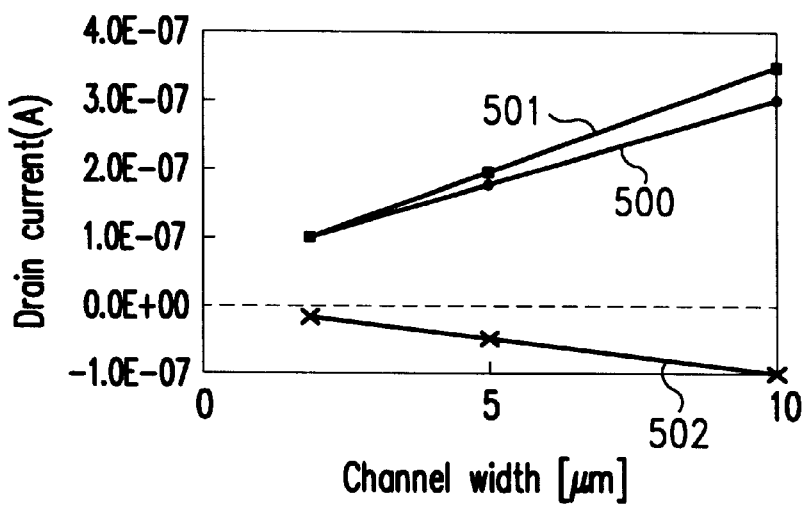
FIG. 6 illustrates the resulted data of an experiment using the four sets of semiconductor devices being tested according to the preferred embodiment.

To illustrate the forgoing theory in the preferred embodiment of the present invention, four sets of semiconductor devices are tested by the steps mentioned in the aforementioned preferred embodiment of the present invention, and the drain to source current of every semiconductor device are measured. Every set of the semiconductor device includes three MOS having different channel width. The data of every device and the measured data are shown as in FIG. 6 and the plot of $I_{ds}$ versus channel width is shown in FIG. 7. The line 500 represents the result of testing the semiconductor set including 3 NMOS with kink effect. The line 501 represents the result of testing the semiconductor set including 3 NMOS without kink effect. The line 502 represents the result of testing the semiconductor set including 3 PMOS with kink effect. As noted that, the line representing the set of PMOS without kink effect is not shown in FIG. 7 because the line is far away.

As will be understood by persons skilled in the art, the preferred embodiment of the present invention is illustrative of the present invention rather than limiting the present invention. Having described the invention in connection with a preferred embodiment, for example, if the various mathematical approach is used in the preferred embodiment. As long as the current in the parasitic device is used to measure the extent of kink effect, the modification will now suggest itself to those skilled in the art. While the preferred embodiment of the invention has been illustrated and described, it will be appreciated that various changes can be made therein without departing from the spirit and scope of the invention.

What is claimed is:

1. A method for measuring kink effect of a first semiconductor device, said method comprising:

choosing a second semiconductor device, and a third semiconductor device, said first semiconductor device, said second semiconductor device, and said third semiconductor device having same channel length and different channel width;

applying a first voltage on a drain electrode of said first semiconductor device, said second semiconductor device, and said third semiconductor device;

measuring a plurality of threshold voltage of said first semiconductor device, said second semiconductor device, and said third semiconductor device;

measuring a plurality of source to drain current by applying said plurality of threshold voltages on a plurality of gate electrodes of said first semiconductor device, said second semiconductor device, and said third semiconductor device;

generating a slope by dividing a first drain current difference by a first channel width difference, said first drain current difference being formed of a subtraction of a second drain to source current of said second semiconductor device and a third drain to source current of said third semiconductor device, said first channel width difference being formed of a subtraction of said second channel width of said second semiconductor device and said third channel width of said third semiconductor device;

subtracting a first drain to source current of said first semiconductor device by a product to acquire a parasitic current, said product being formed of the product of said slope and a first channel width of said third semiconductor.

2. The method as claim 1, said method further comprising:

dividing said parasitic current by a channel length of said first semiconductor device to obtain a linear current density as an index representing the kink effect of the first semiconductor device.

* * * * *